US012690166B2

(12) United States Patent
Kohara et al.

(10) Patent No.: US 12,690,166 B2
(45) Date of Patent: Jul. 21, 2026

(54) COOLING DEVICE

(71) Applicant: DENSO CORPORATION, Kariya-city (JP)

(72) Inventors: Kimio Kohara, Kariya-city (JP); Takahito Shibata, Kariya-city (JP); Yoichiro Kawamoto, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 266 days.

(21) Appl. No.: 18/461,375

(22) Filed: Sep. 5, 2023

(65) Prior Publication Data

US 2023/0413482 A1      Dec. 21, 2023

Related U.S. Application Data

(63) Continuation of application No. PCT/JP2022/005522, filed on Feb. 11, 2022.

(30) Foreign Application Priority Data

Mar. 10, 2021      (JP) ................................. 2021-037980

(51) Int. Cl.
*H05K 7/20*      (2006.01)
(52) U.S. Cl.
CPC ......... *H05K 7/203* (2013.01); *H05K 7/20327* (2013.01)
(58) Field of Classification Search
CPC ............... H05K 7/20236; H05K 7/203; H05K 7/20272; H05K 5/06; H05K 7/20327; H05K 7/20809; H05K 7/20927; H05K 7/20936; H05K 7/2039; H01L 23/44
See application file for complete search history.

(56) References Cited

U.S. PATENT DOCUMENTS

| | | | | |
|---|---|---|---|---|
| 5,293,754 A | * | 3/1994 | Mizuno .............. | H05K 7/20281 |
| | | | | 165/286 |
| 2017/0280587 A1 | * | 9/2017 | Watanabe .......... | H05K 7/20236 |
| 2017/0295670 A1 | * | 10/2017 | Campbell .......... | H05K 7/20936 |
| 2019/0014685 A1 | * | 1/2019 | So ...................... | H05K 7/20236 |

(Continued)

FOREIGN PATENT DOCUMENTS

| | | |
|---|---|---|
| JP | 2017150715 A | 8/2017 |
| JP | 2019016764 A | 1/2019 |
| JP | 2020126936 A | 8/2020 |

*Primary Examiner* — Mandeep S Buttar
(74) *Attorney, Agent, or Firm* — Harness, Dickey & Pierce, P.L.C.

(57) ABSTRACT

A cooling device includes a cooling tank, a liquid storage tank, and a connector. The cooling tank stores refrigerant liquid for immersing and cooling a heating element. The liquid storage tank stores the refrigerant liquid outside the cooling tank and has an atmosphere opening portion. The connector connects the two tanks and allows the refrigerant liquid to pass through the connector. One end of the connector has a cooling-tank opening portion located in a gravity direction at a position lower than or same as a liquid level of the refrigerant liquid. An upper portion of the cooling tank stores a gas generated in the cooling tank. The refrigerant liquid flows between the two tanks via the connector in accordance with a change in volume of the gas. The liquid storage tank is provided upward of the cooling tank. The two tanks are connected only by the connector.

8 Claims, 6 Drawing Sheets

(56) References Cited

U.S. PATENT DOCUMENTS

| 2019/0297754 A1* | 9/2019 | Avalos Garcia ... | H05K 7/20772 |
|---|---|---|---|
| 2020/0253086 A1* | 8/2020 | Ohga ................. | H05K 7/20272 |
| 2021/0185857 A1* | 6/2021 | Zhong ................ | H05K 7/20236 |

* cited by examiner

COOLING DEVICE

CROSS REFERENCE TO RELATED APPLICATIONS

The present application is a continuation application of International Patent Application No. PCT/JP2022/005522 filed on Feb. 11, 2022, which designated the U.S. and claims the benefit of priority from Japanese Patent Application No. 2021-037980 filed on Mar. 10, 2021. The entire disclosures of all of the above applications are incorporated herein by reference.

TECHNICAL FIELD

The present disclosure relates to a cooling device.

BACKGROUND

A cooling device for cooling a heating element immerses the heating element in refrigerant liquid.

SUMMARY

According to at least one embodiment, a cooling device includes a cooling tank, a liquid storage tank, and a connector. The cooling tank stores refrigerant liquid for immersing and cooling a heating element. The liquid storage tank stores the refrigerant liquid outside the cooling tank and has an atmosphere opening portion opening to an atmosphere. The connector connects the liquid storage tank and the cooling tank and allows the refrigerant liquid to pass through the connector.

One end of the connector facing the cooling tank has a cooling-tank opening portion located in a gravity direction at a position lower than or same as a liquid level of the refrigerant liquid in the cooling tank. An upper portion of the cooling tank stores a gas generated in the cooling tank.

The refrigerant liquid flows between the cooling tank and the liquid storage tank via the connector in accordance with a change in volume of the gas in the upper portion of the cooling tank. The liquid storage tank is provided upward of the cooling tank in the gravity direction. The cooling tank and the liquid storage tank are connected only by the connector.

BRIEF DESCRIPTION OF DRAWINGS

The details of one or more embodiments are set forth in the accompanying drawings and the description below. Other features and advantages will be apparent from the description and drawings, and from the claims.

DETAILED DESCRIPTION

Figure 1:
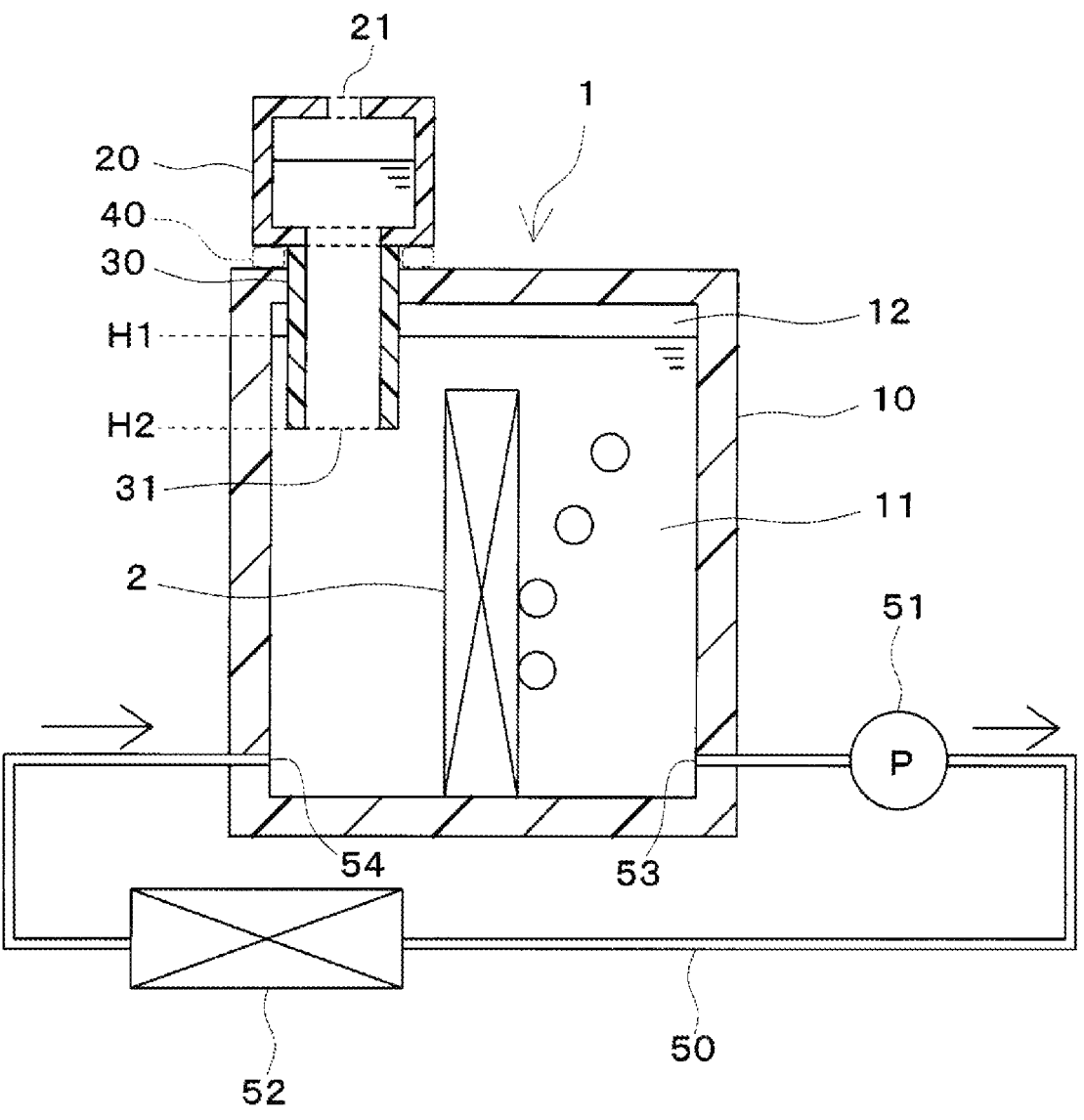
FIG. 1 is a diagram illustrating a configuration of a cooling device according to a first embodiment.

To begin with, examples of relevant techniques will be described.

In a cooling device for cooling a heating element such as an electronic device by immersing the heating element in refrigerant liquid, the refrigerant liquid can be reduced due to vaporization of the refrigerant liquid by heat generation of the heating element, and insufficient cooling of the heating element may be caused.

Contrary to this, a comparative example in which a sealing tank that accommodates a sealing material is provided outside a cooling tank in which a heating element is immersed in a refrigerant liquid, and the sealing tank functions as a trap or a seal, thereby reducing discharge of refrigerant vapor generated in the cooling tank to the outside.

However, since temperature of the cooling tank becomes higher than that of the sealing tank due to the heat generation of the heating element, if the refrigerant liquid evaporated in the cooling tank continues to condense in the sealing tank, the sealing tank may eventually be filled with the refrigerant liquid, and the refrigerant liquid or the sealing material may overflow from the sealing tank to the outside.

According to one aspect of the present disclosure, a cooling device includes a cooling tank, a liquid storage tank, and a connector. The cooling tank stores refrigerant liquid for immersing and cooling a heating element. The liquid storage tank stores the refrigerant liquid outside the cooling tank and has an atmosphere opening portion opening to an atmosphere. The connector connects the liquid storage tank and the cooling tank and allows the refrigerant liquid to pass through the connector.

One end of the connector facing the cooling tank has a cooling-tank opening portion located in a gravity direction at a position lower than or same as a liquid level of the refrigerant liquid in the cooling tank. An upper portion of the cooling tank stores a gas generated in the cooling tank.

The refrigerant liquid flows between the cooling tank and the liquid storage tank via the connector in accordance with a change in volume of the gas in the upper portion of the cooling tank. The liquid storage tank is provided upward of the cooling tank in the gravity direction. The cooling tank and the liquid storage tank are connected only by the connector.

Thus, an outflow of the gas-phase refrigerant from the atmosphere opening portion of the liquid storage tank to the outside via the connector can be reduced. As a result, a decrease in the refrigerant liquid in the cooling tank can be reduced.

Hereinafter, embodiments for implementing the present disclosure is described referring to drawings. In each embodiment, the same reference numerals may be given to parts corresponding to matters described in a preceding embodiment, and overlapping explanations may be omitted. When only a part of the configuration is described in each embodiment, the previously described other embodiments can be applied to other parts of the configuration. The present disclosure is not limited to combinations of embodiments which combine parts that are explicitly described as being combinable. As long as no problems are present, the various embodiments may be partially combined with each other even if not explicitly described.

First Embodiment

A first embodiment of the present disclosure will be described with reference to the drawings. In FIG. 1, an up-down direction of the drawing is a gravity direction.

As shown in FIG. 1, a cooling device 1 of the first embodiment includes a cooling tank 10, a liquid storage tank 20, and a connector 30. The cooling tank 10, the liquid storage tank 20, and the connector 30 are made of, for example, a resin material or a metal material.

The cooling tank 10 is a container in which an electronic device 2 to be cooled is accommodated. The electronic device 2 is a heating element that generates heat with operation and requires cooling. The electronic device 2 is, for example, an electronic substrate on which a heating element is mounted, an inverter, or the like. The electronic device 2 of the present embodiment is a plate-like member, and is disposed such that a plate surface of the electronic device is parallel to the gravity direction. The electronic device 2 corresponds to a heating element of the present disclosure.

Refrigerant liquid 11 for cooling the electronic device 2 is stored in the cooling tank 10. The electronic device 2 is immersed in the refrigerant liquid 11. In the present embodiment, a fluorine-based inert liquid is used as the refrigerant liquid 11. The fluorine-based inert liquid is a refrigerant liquid having excellent insulating properties, heat transfer characteristics, and stability. In the present embodiment, the refrigerant liquid 11 having a low boiling point lower than about 120° C. is used. The fluorine-based inert liquid is, for example, Novec (trade name of 3M) having a hydro fluoro ether (HFE) structure or Fluorinert (trade name of 3M) having a perfluorocarbon (PFC) structure.

The boiling point of the refrigerant liquid 11 is lower than a heat generation temperature of the electronic device 2. In the present embodiment, the refrigerant liquid 11 having a boiling point about 10 to 20° C. lower than the heat generation temperature of the electronic device 2 is used. Therefore, the refrigerant liquid 11 can be boiled by heat generation of the electronic device 2, and boiling cooling in which the refrigerant liquid 11 boils and absorbs heat from the electronic device 2 is performed in the cooling tank 10. In the present embodiment, subcool boiling is performed in which the refrigerant liquid 11 in contact with the electronic device 2 boils and the refrigerant liquid 11 in the cooling tank 10 boils in a state of being a subcool liquid having a temperature lower than the boiling point.

The gas-phase refrigerant generated by the boiling of the refrigerant liquid 11 is condensed and reduced by the subcool liquid, but bubbles that cannot be condensed move upward inside the refrigerant liquid 11. The gas generated in the cooling tank 10 is stored in an upper portion of the cooling tank 10 to form a gas portion 12. The gas portion 12 contains the gas-phase refrigerant, dissolved gas discharged from the refrigerant liquid 11, air present in the cooling tank 10 from the beginning, and the like. A volume of the gas portion 12 is variable and may become 0 volume.

The gas-phase refrigerant contained in the gas portion 12 is generated by vaporization of the refrigerant liquid 11 inside the cooling tank 10. The vaporization of the refrigerant liquid 11 includes boiling and evaporation of the refrigerant liquid 11. The gas-phase refrigerant contained in the gas portion 12 is condensed to become the refrigerant liquid 11 of liquid-phase.

A dissolved gas mainly composed of an atmosphere is dissolved in the refrigerant liquid 11. The dissolved gas contained in the gas portion 12 is generated by the dissolved gas dissolved in the refrigerant liquid 11 being discharged from the refrigerant liquid 11. Solubility of the dissolved gas dissolved in the refrigerant liquid 11 varies depending on a temperature of the refrigerant liquid 11 and the like. The solubility of the dissolved gas decreases, and the dissolved gas is released from the refrigerant liquid 11 when the temperature of the refrigerant liquid 11 increases. The dissolved gas released from the refrigerant liquid 11 forms the gas portion 12 together with the gas-phase refrigerant. The dissolved gas contained in the gas portion 12 can be dissolved again in the refrigerant liquid 11 by the temperature decrease of the refrigerant liquid 11.

The liquid storage tank 20 is a container capable of storing the refrigerant liquid 11 therein. The liquid storage tank 20 is provided outside the cooling tank 10. In the present embodiment, the liquid storage tank 20 is provided to face an upper surface of the cooling tank 10.

An atmosphere opening 21 is provided in an upper portion of the liquid storage tank 20. An inside of the liquid storage tank 20 communicates with the atmosphere via the atmosphere opening 21 at the upper portion. The liquid storage tank 20 is open to the atmosphere, and the atmosphere is present upward of the refrigerant liquid 11 inside the liquid storage tank 20.

The liquid storage tank 20 is connected to the cooling tank 10 by the connector 30. The connector 30 is a cylindrical member, and the refrigerant liquid 11 is capable of passing through the inside thereof. The connector 30 has one end connected to the cooling tank 10 and the other end connected to the liquid storage tank 20. The connector 30 of the present embodiment is provided so as to penetrate the upper surface of the cooling tank 10.

The inside of the liquid storage tank 20 communicates with the cooling tank 10 through the connector 30 on a lower portion. Since the inside of the liquid storage tank 20 is open to the atmosphere through the atmosphere opening 21, the inside of the liquid storage tank 20 and the inside of the cooling tank 10 are maintained at atmospheric pressure. That is, the cooling device 1 of the present embodiment is of an open air type.

A cooling-tank opening 31 is provided at a position near the cooling tank 10 and at the one end of the connector 30. In the present embodiment, the cooling-tank opening 31 is provided at a lower portion of the connector 30 in the gravity direction, and the cooling-tank opening 31 opens downward in the gravity direction.

A liquid level of the refrigerant liquid 11 in the cooling tank 10 is normally located above the cooling-tank opening 31, and can be lowered to the cooling-tank opening 31 when the volume of the gas portion 12 increases. Therefore, the cooling-tank opening 31 is located below or at the same height as the liquid level of the refrigerant liquid 11 in the cooling tank 10 in the gravity direction. That is, a height H2 in the gravity direction of the cooling-tank opening 31 is at a position lower than or equal to a height H1 of the liquid level of the refrigerant liquid 11.

The inside of the liquid storage tank 20 communicates with the inside of the cooling tank 10 via the connector 30. Therefore, the refrigerant liquid 11 is capable of flowing between the cooling tank 10 and the liquid storage tank 20 via the connector 30. The refrigerant liquid 11 flows between the cooling tank 10 and the liquid storage tank 20 according to volume variation of the gas portion 12.

Since the refrigerant liquid 11 flows between the cooling tank 10 and the liquid storage tank 20, the volume of the refrigerant liquid 11 in the cooling tank 10 and the volume of the refrigerant liquid 11 in the liquid storage tank 20 vary in conjunction with each other. More specifically, the volume of the refrigerant liquid 11 in the liquid storage tank 20 increases when the volume of the refrigerant liquid 11 in the cooling tank 10 decreases, and the volume of the refrigerant liquid 11 in the liquid storage tank 20 decreases when the volume of the refrigerant liquid 11 in the cooling tank 10 increases.

In the present embodiment, the cooling tank 10 and the liquid storage tank 20 are not in contact with each other, and a gap is formed between the cooling tank 10 and the liquid storage tank 20. An air layer, which is a gap formed between the cooling tank 10 and the liquid storage tank 20, functions as a heat insulating portion 40. The heat insulating portion 40 suppresses heat transfer between the cooling tank 10 and the liquid storage tank 20.

A circulation circuit 50 for circulating the refrigerant liquid 11 in the cooling tank 10 is connected to the cooling tank 10. A circulation pump 51 and a heat exchanger 52 are provided in the circulation circuit 50.

The circulation pump 51 pumps and circulates the refrigerant liquid 11 in the circulation circuit 50. The heat exchanger 52 dissipates heat of the refrigerant liquid 11 to cool the refrigerant liquid. The heat exchanger 52 is, for example, a radiator that cools the refrigerant liquid 11 by exchanging heat with an outside air, a chiller that cools the refrigerant liquid 11 by exchanging heat with a low-temperature refrigerant of a refrigeration cycle, or the like. Since the heat exchanger 52 cools the refrigerant liquid 11, a temperature rise of the refrigerant liquid 11 can be suppressed, and the subcooled state of the refrigerant liquid 11 can be maintained.

The circulation circuit 50 is connected to the cooling tank 10 at an inlet portion 53 and an outlet portion 54. The refrigerant liquid 11 in the cooling tank 10 flows into the circulation circuit 50 through the inlet portion 53. The refrigerant liquid 11 circulated through the circulation circuit 50 flows out to the cooling tank 10 through the outlet portion 54.

A flow of the refrigerant liquid 11 from the outlet portion 54 toward the inlet portion 53 is formed in the cooling tank 10. In an example shown in FIG. 1, the outlet portion 54 is provided on a left of the cooling tank 10, and the inlet portion 53 is provided on a right of the cooling tank 10. Therefore, a flow of the refrigerant liquid 11 from the left to the right is formed inside the cooling tank 10.

The gas-phase refrigerant generated by the refrigerant liquid 11 boiling due to the heat generation of the electronic device 2 becomes bubbles, and the bubbles rise inside the cooling tank 10 while moving downward in a flow direction of the refrigerant liquid 11. The cooling-tank opening 31 of the connector 30 is provided at a position where it is difficult for the gas-phase refrigerant to flow in. More specifically, the cooling-tank opening 31 is provided upstream in the flow direction of the refrigerant liquid 11 in the cooling tank 10. That is, the cooling-tank opening 31 is provided near the outlet portion 54 than the inlet portion 53 in the flow direction of the refrigerant liquid 11.

Next, a description will be given on operation of the cooling device 1 of the present embodiment having the above configuration.

In the cooling tank 10, the refrigerant liquid 11 in the vicinity of the electronic device 2 boils due to the heat generation of the electronic device 2, and a gas-phase refrigerant is generated. The gas-phase refrigerant rises inside the cooling tank 10 as bubbles and forms the gas portion 12. The dissolved gas released from the refrigerant liquid 11 due to the temperature rise of the refrigerant liquid 11 also forms the gas portion 12 together with the gas-phase refrigerant. The gas-phase refrigerant obtained by vaporizing the refrigerant liquid 11 and the dissolved gas discharged from the refrigerant liquid 11 are stored in the cooling tank 10.

The gas-phase refrigerant generated by boiling rises in the refrigerant liquid 11 as bubbles. Since the refrigerant liquid 11 in the cooling tank 10 is a subcool liquid, the air bubbles formed of the gas-phase refrigerant are cooled by the refrigerant liquid 11 when moving up inside the refrigerant liquid 11, and the gas-phase refrigerant condenses. As a result, the bubbles formed of the gas-phase refrigerant are reduced in a middle of rising inside the refrigerant liquid 11, and the bubbles disappear when a subcool degree of the refrigerant liquid 11 is large.

The refrigerant liquid 11 in the cooling tank 10 is supplied to the heat exchanger 52 through the circulation circuit 50 and is cooled by the heat exchanger 52. By the cooling by the heat exchanger 52, the refrigerant liquid 11 can be actively maintained in the subcooled state.

The gas-phase refrigerant generated by boiling of the refrigerant liquid 11 in the vicinity of the electronic device 2 rises while moving downward in the flow direction of the refrigerant liquid 11. Since the cooling-tank opening 31 of the connector is provided upstream in the flow direction of the refrigerant liquid 11 in the cooling tank 10, the gas portion 12 can be formed inside the cooling tank 10 without the gas-phase refrigerant flowing into the cooling-tank opening 31.

In the cooling tank 10, the volume of the gas portion 12 increases due to the vaporization of the refrigerant liquid 11 and the release of the dissolved gas from the refrigerant liquid 11. As the volume of the gas portion 12 increases, the volume of the refrigerant liquid 11 in the cooling tank 10 decreases. As the volume of the refrigerant liquid 11 in the cooling tank 10 decreases, the refrigerant liquid 11 flows from the cooling tank 10 to the liquid storage tank 20, and the volume of the refrigerant liquid 11 in the liquid storage tank 20 increases.

The temperature of the refrigerant liquid 11 decreases, in the cooling tank due to a decrease in an amount of heat generation of the electronic device 2, or an increase in cooling capacity of the heat exchanger 52. By decreasing the temperature of the refrigerant liquid 11, condensation of the gas-phase refrigerant contained in the gas portion 12 is promoted, and dissolution of the dissolved gas contained in the gas portion 12 into the refrigerant liquid 11 is promoted.

In the cooling tank 10, the volume of the gas portion 12 decreases and the volume of the refrigerant liquid 11 increases due to condensation of the gas-phase refrigerant contained in the gas portion 12 and dissolution of the dissolved gas contained in the gas portion 12 into the refrigerant liquid 11. The refrigerant liquid 11 flows from the liquid storage tank 20 to the cooling tank 10, and the volume of the refrigerant liquid 11 decreases inside the liquid storage tank 20 when the volume of the refrigerant liquid 11 increases.

In the present embodiment described above, the cooling-tank opening 31 of the connector 30 is located below or at the same height as the liquid level of the refrigerant liquid 11 of the cooling tank 10 in the gravity direction. Further, the gas generated in the cooling tank 10 is stored in the upper portion of the cooling tank 10 to form the gas portion 12, and the refrigerant liquid 11 flows between the cooling tank 10 and the liquid storage tank 20 via the connector 30 according to the volume variation of the gas portion 12. Thus, an outflow of the gas-phase refrigerant from the atmosphere opening 21 of the liquid storage tank 20 to the outside via the connector 30 can be reduced. As a result, in the cooling device 1, a decrease in the refrigerant liquid 11 in the cooling tank 10 can be reduced even when the cooling device 1 is used for a long period of time.

Further, in the present embodiment, the cooling device 1 of the open air type having the atmosphere opening 21 communicating with the atmosphere is used. Accordingly, a decrease in the refrigerant liquid 11 in the cooling tank 10 can be reduced without using a pressure resistant container for sealing the refrigerant liquid 11. Therefore, the cooling device 1 can be downsized.

In addition, in the cooling device 1 of the present embodiment, the boiling cooling in which the refrigerant liquid 11 boils due to the heat generation of the electronic device 2 is performed. In the boiling cooling, the electronic device 2 can be efficiently cooled, but on the other hand, a generation amount of the gas-phase refrigerant increases, and the gas-phase refrigerant easily flows out to the outside. According to the present embodiment, also in the cooling device 1 that performs the boiling cooling for boiling the refrigerant liquid 11, a decrease in the refrigerant liquid 11 can be effectively reduced.

In the present embodiment, the refrigerant liquid 11 in the cooling tank 10 is a subcool liquid, and subcool boiling is performed. Therefore, the gas-phase refrigerant generated by boiling of the refrigerant liquid 11 due to the heat generation of the electronic device 2 is cooled and condensed by the refrigerant liquid 11 formed of the subcool liquid. Accordingly, the gas-phase refrigerant from flowing to the circulation pump 51 and the heat exchanger 52 via the circulation circuit 50 can be reduced, and the performance of the circulation pump 51 and the heat exchanger 52 can be maintained to stably use them.

In the present embodiment, the refrigerant liquid 11 in the cooling tank 10 is circulated by the circulation circuit 50, and the refrigerant liquid 11 is cooled by the heat exchanger 52. Accordingly, the temperature rise of the refrigerant liquid 11 can be reduced, and the gas-phase refrigerant can be effectively cooled by the refrigerant liquid 11 in the subcooled state. As a result, an increase in the volume of the gas portion 12 can be reduced, and a decrease in the liquid level of the refrigerant liquid 11 in the cooling tank 10 and an increase in the liquid level of the refrigerant liquid 11 in the liquid storage tank 20 can be reduced.

Further, in the present embodiment, the cooling-tank opening 31 of the connector 30 is provided upstream in the flow direction of the cooling tank 10. Since bubbles formed of the gas-phase refrigerant rise while moving downstream in the flow direction of the refrigerant liquid 11, the bubbles rise while moving away from the cooling-tank opening 31. Therefore, the gas-phase refrigerant from flowing into the cooling-tank opening 31 provided upstream in the flow direction of the cooling tank 10 can be reduced. Accordingly, an outflow of the gas-phase refrigerant generated inside the cooling tank 10 to the outside from the atmosphere opening 21 of the liquid storage tank 20 through the cooling-tank opening 31 can be reduced, and a decrease in the refrigerant liquid 11 can be reduced.

In the present embodiment, the heat insulating portion 40 is provided between the cooling tank 10 and the liquid storage tank 20. Thus, heat transfer from the cooling tank 10 to the liquid storage tank 20 can be reduced, and the refrigerant liquid 11 can be reduced from evaporating in the liquid storage tank 20 and flowing out to the outside.

In the present embodiment, the cooling tank 10, the liquid storage tank 20, and the connector 30 are made of a resin material. Thus, a size and weight of the cooling tank 10 and the like can be reduced, manufacturing costs of the cooling tank 10 and the like can be reduced, and a degree of freedom of the shape of the cooling tank 10 and the like can be increased. Furthermore, since the cooling tank 10, the liquid storage tank 20, and the connector 30 are made of a resin material, heat transfer from the cooling tank 10 to the liquid storage tank 20 can be reduced, and the refrigerant liquid 11 can be suppressed from evaporating in the liquid storage tank 20 and flowing out to the outside.

Second Embodiment

The following describes a second embodiment of the present disclosure. Hereinafter, only portions different from the first embodiment will be described.

Figure 2:
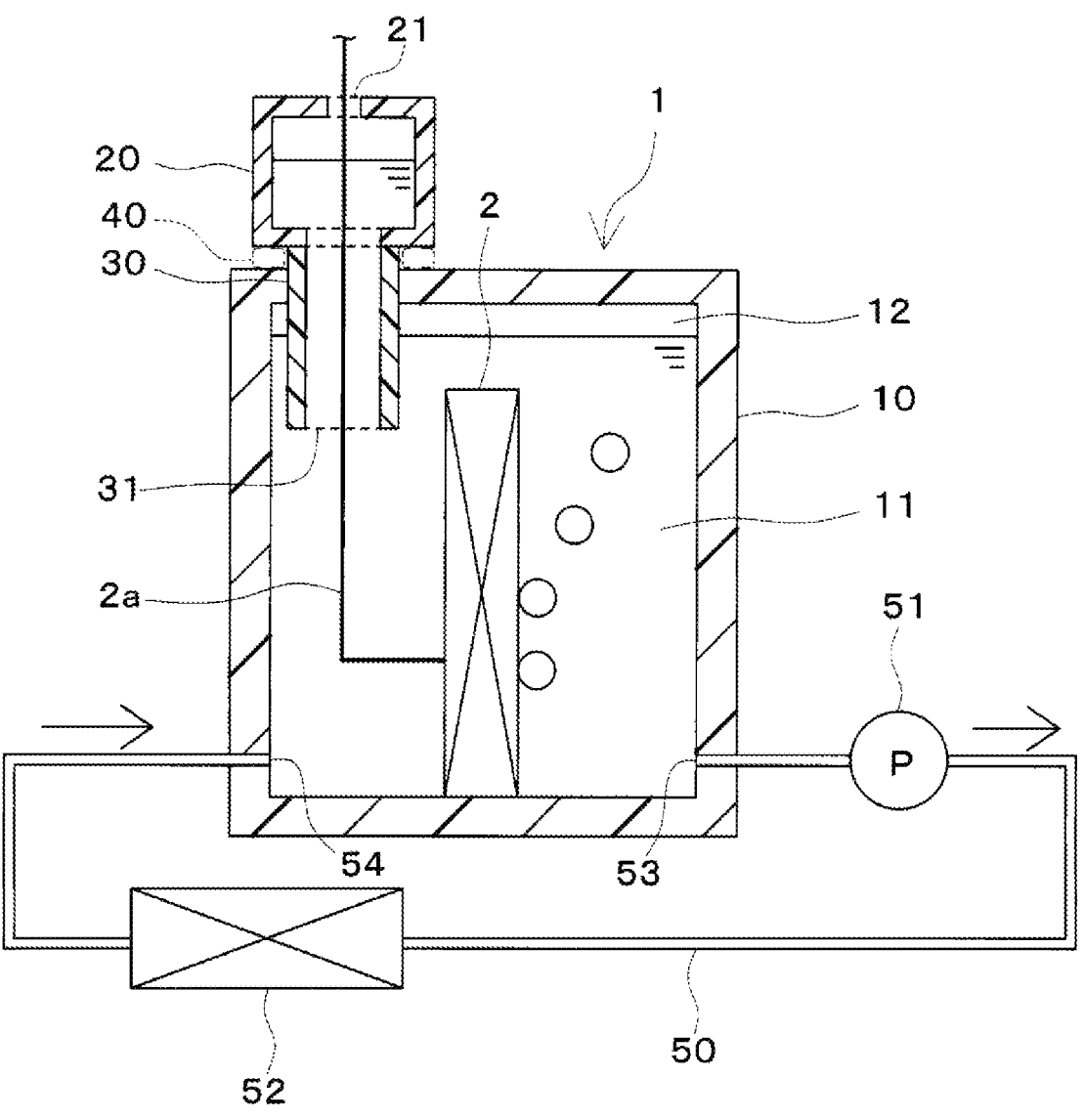
FIG. 2 is a diagram illustrating a configuration of a cooling device according to a second embodiment.

As shown in FIG. 2, a wire 2a is connected to the electronic device 2 of the second embodiment. The wire 2a functions as a power supply and a transmission path of an electric signal. The wire 2a is provided so as to extend from a cooling tank 10 to a connector 30 and a liquid storage tank 20. The wire 2a is extended to an outside from an atmosphere opening 21 of the liquid storage tank 20.

As described above, in the second embodiment, the wire 2a of the electronic device 2 is taken out to the outside by using the atmosphere opening 21 opened to the atmosphere. Therefore, the wire 2a of the electronic device 2 can be taken out to the outside without providing a seal structure for preventing the refrigerant liquid 11 from flowing out to the outside.

Third Embodiment

The following describes a third embodiment of the present disclosure. Hereinafter, only portions different from the above embodiments will be described.

Figure 3:
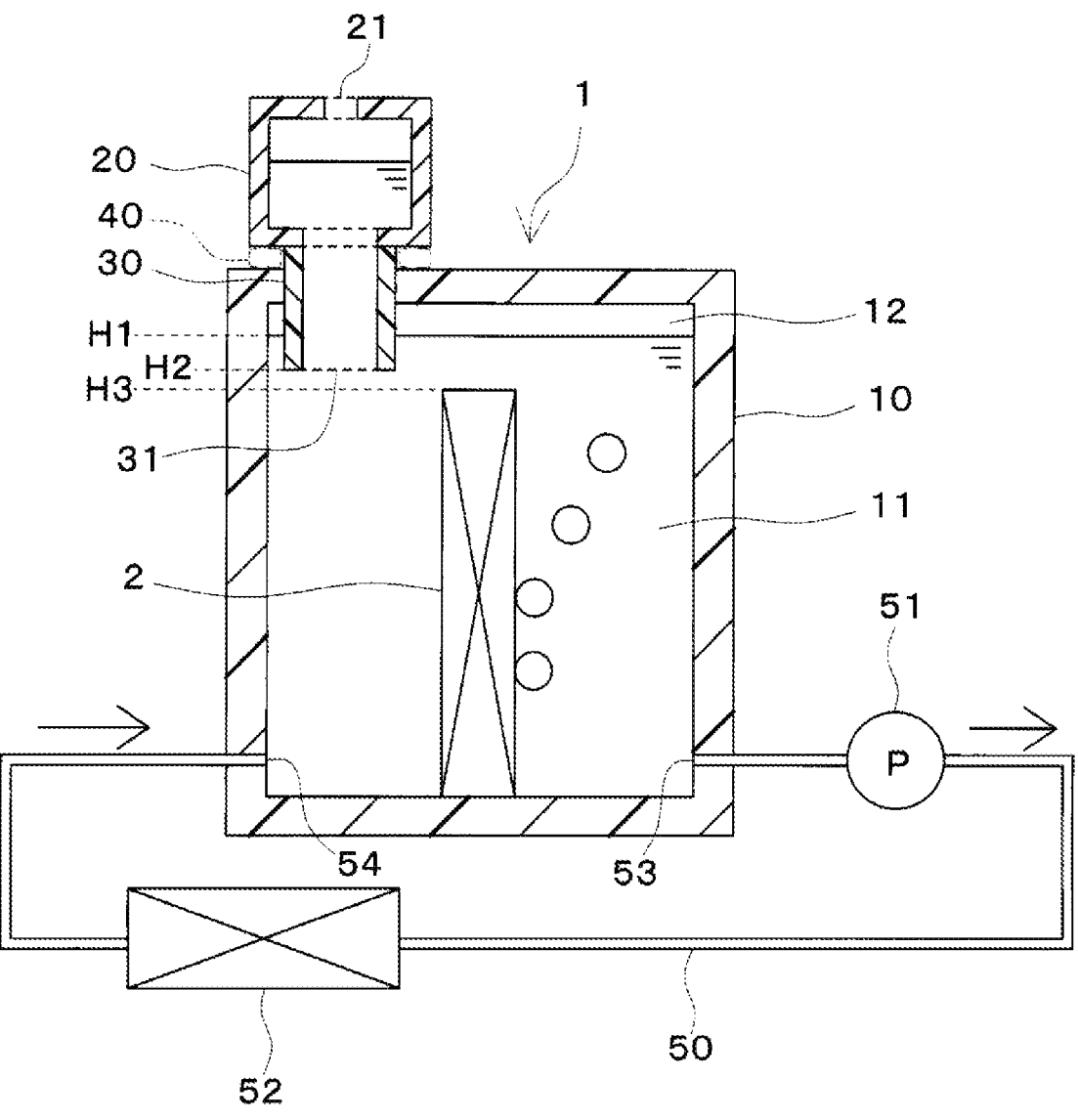
FIG. 3 is a diagram illustrating a configuration of a cooling device according to a third embodiment.

As shown in FIG. 3, in the third embodiment, a cooling-tank opening 31 of a connector 30 is located above an electronic device 2 in a gravity direction. That is, a height H2 in the gravity direction of the cooling-tank opening 31 of the connector 30 is higher than a height H3 in the gravity direction of the electronic device 2. The height H3 in the gravity direction of the electronic device 2 is a height of an upper end portion of the electronic device 2.

According to the third embodiment described above, even when a volume of a gas portion 12 increases, a liquid level of the refrigerant liquid 11 falls only to the cooling-tank opening 31 of the connector 30. Therefore, the liquid level of the refrigerant liquid 11 is always maintained at a position higher than that of the electronic device 2. Thus, the electronic device 2 can be always immersed in the refrigerant liquid 11 without being exposed from the refrigerant liquid 11, and cooling capacity of the cooling device 1 can be maintained. An excess gas of the gas portion 12 is discharged to the outside from the atmosphere opening 21 of the liquid storage tank 20 through the cooling-tank opening 31 when the gas portion 12 reaches the cooling-tank opening 31.

Fourth Embodiment

Next, a fourth embodiment of the present disclosure is described. Hereinafter, only portions different from the above embodiments will be described.

Figure 4:
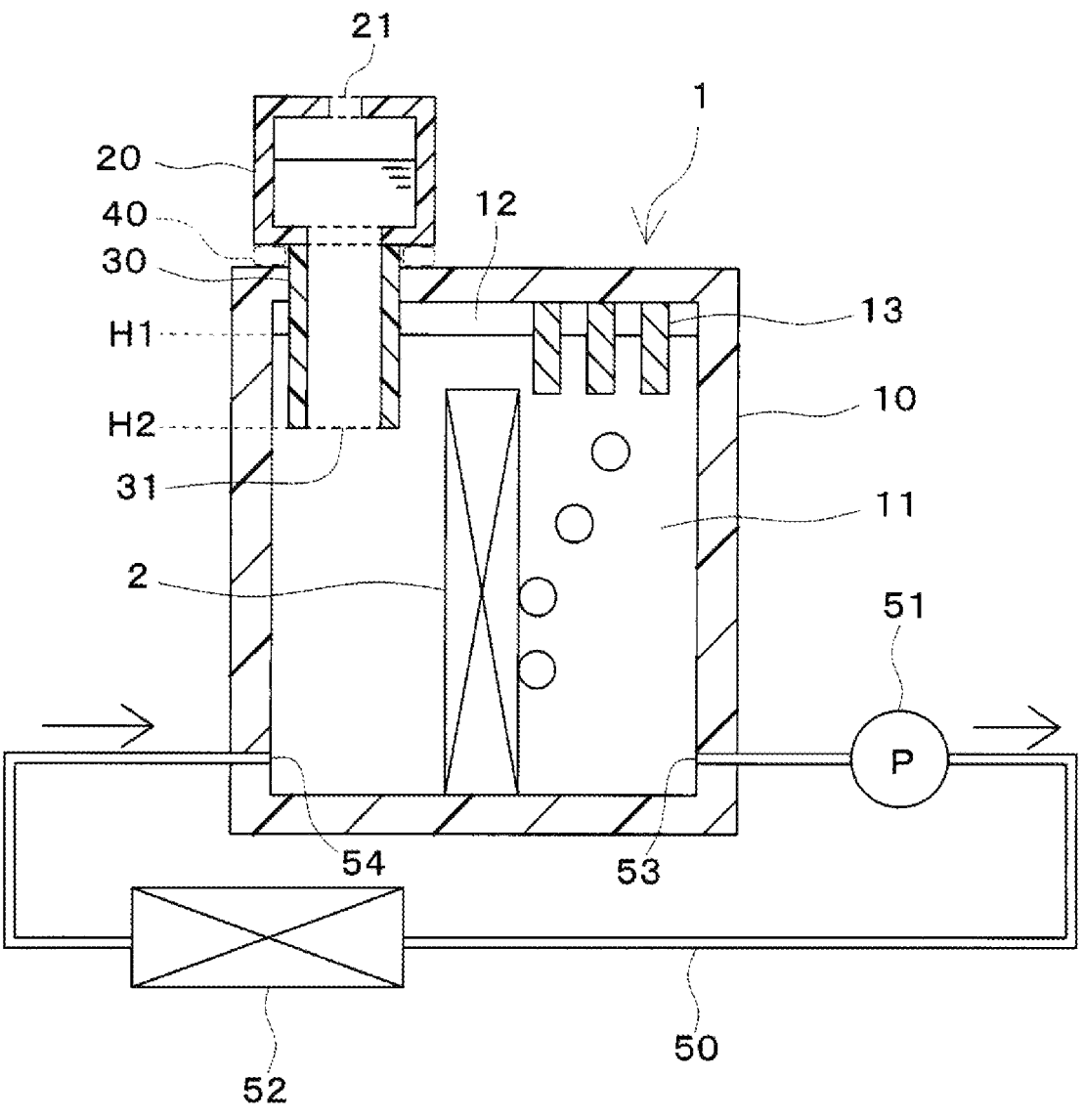
FIG. 4 is a diagram illustrating a configuration of a cooling device according to a fourth embodiment.

As shown in FIG. 4, a heat transfer portion 13 is provided at the cooling tank 10 of the fourth embodiment. The heat transfer portion 13 is disposed so as to straddle a refrigerant liquid 11 and a gas portion 12 inside a cooling tank 10, and promotes heat transfer between the refrigerant liquid 11 and the gas portion 12. The heat transfer portion 13 is fixed to an inner wall of an upper surface of the cooling tank 10. In an example illustrated in FIG. 4, three heat transfer portions 13 are provided, but a number of heat transfer portions 13 can be arbitrarily set and may be one or more.

A material having an excellent heat transfer coefficient is used for the heat transfer portion 13. For example, a metal plate made of aluminum or copper can be used as the heat transfer portion 13.

According to the fourth embodiment described above, the gas portion 12 is cooled by the refrigerant liquid 11 through the heat transfer portion 13. Thus, condensation of the gas-phase refrigerant contained in the gas portion 12 can be promoted, and an increase in the volume of the gas portion 12 can be reduced. As a result, a liquid level of the refrigerant liquid 11 in the cooling tank 10 can be prevented from falling, and the liquid level of the refrigerant liquid 11 in the liquid storage tank 20 can be prevented from rising.

Fifth Embodiment

Next, a fifth embodiment of the present disclosure is described. Hereinafter, only portions different from the above embodiments will be described.

Figure 5:
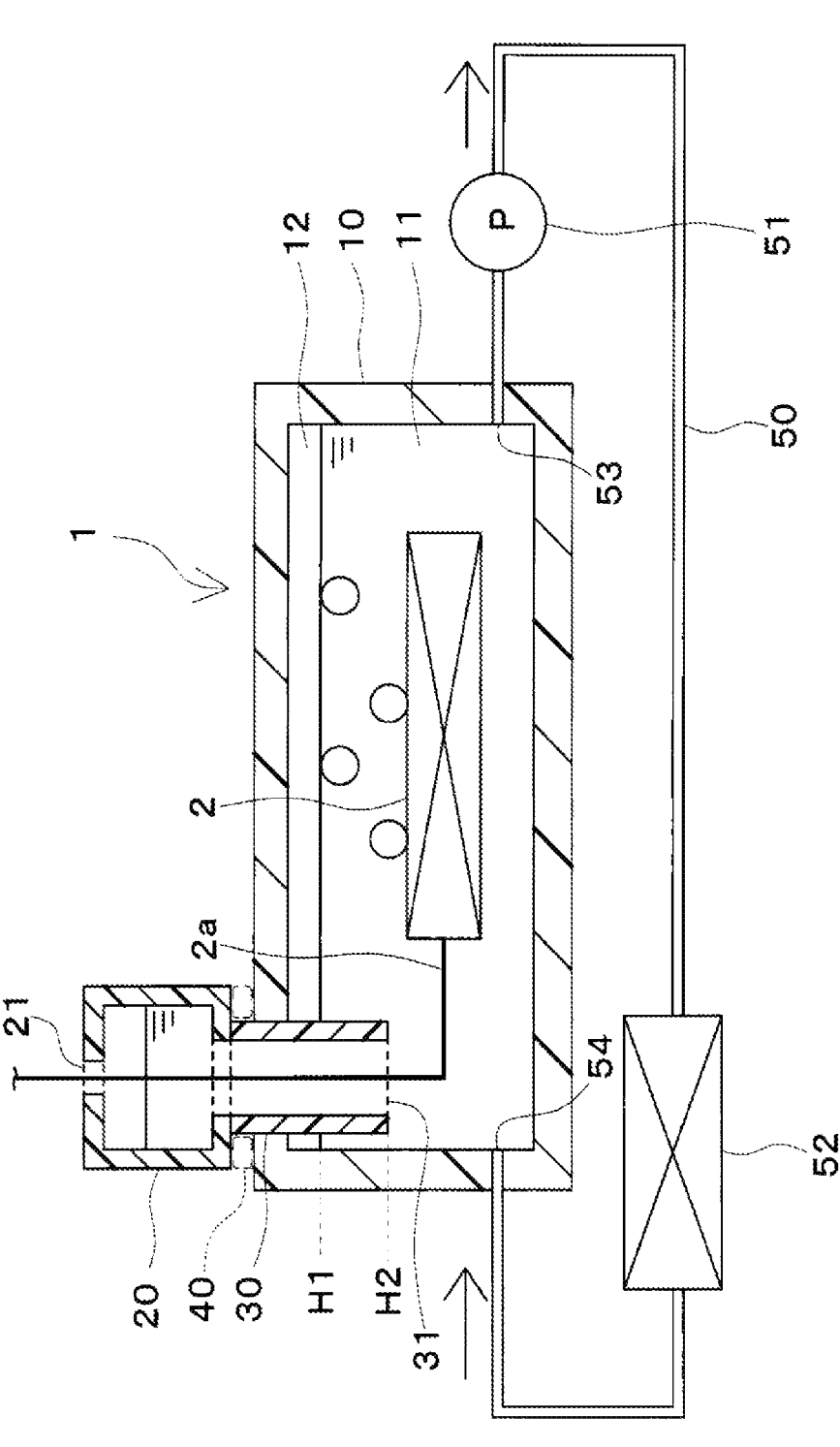
FIG. 5 is a diagram illustrating a configuration of a cooling device according to a fifth embodiment.

As shown in FIG. 5, in the fifth embodiment, an electronic device 2 having a plate shape is horizontally disposed inside a cooling tank 10. That is, in the cooling tank 10, a plate surface of the plate-shaped electronic device 2 is disposed so as to intersect a gravity direction.

Also, in the configuration of the fifth embodiment, the cooling tank 10 and a liquid storage tank 20 are connected to each other by a connector 30, and a height H2 in the gravity direction of a cooling-tank opening 31 of the connector 30 is lower than a liquid level H1 of the refrigerant liquid 11 of the cooling tank 10. As a result, similarly to the first embodiment, an outflow of the gas-phase refrigerant from the atmosphere opening 21 of the liquid storage tank 20 to the outside via the connector 30 can be reduced.

Sixth Embodiment

Next, a sixth embodiment of the present disclosure is described. Hereinafter, only portions different from the above embodiments will be described.

Figure 6:
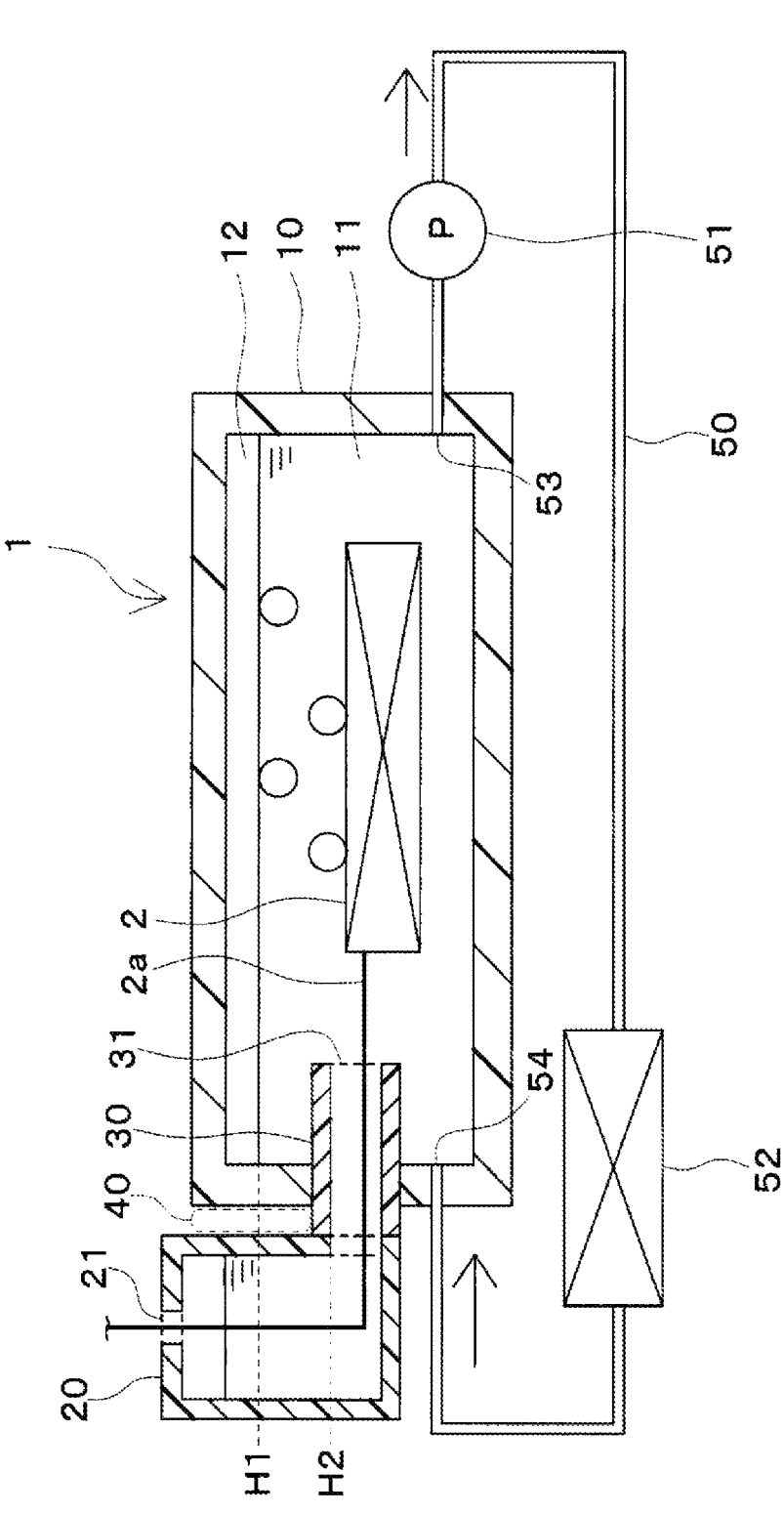
FIG. 6 is a diagram illustrating a configuration of a cooling device according to a sixth embodiment.

As shown in FIG. 6, in the sixth embodiment, a liquid storage tank 20 is provided to face a side surface of a cooling tank 10. A connector 30 of the sixth embodiment is provided so as to penetrate the side surface of the cooling tank 10, and a cooling-tank opening 31 is opened in a horizontal direction. A liquid level of the refrigerant liquid 11 in the liquid storage tank 20 is higher than the liquid level of the refrigerant liquid 11 in the cooling tank 10. A gap is provided between the side surface of the cooling tank 10 and the liquid storage tank 20, and this gap functions as a heat insulating portion 40.

Also, in the configuration of the sixth embodiment, the cooling tank 10 and a liquid storage tank 20 are connected to each other by a connector 30, and a height H2 in the gravity direction of a cooling-tank opening 31 of the connector 30 is lower than a liquid level H1 of the refrigerant liquid 11 of the cooling tank 10. As a result, similarly to the first embodiment, an outflow of the gas-phase refrigerant from the atmosphere opening 21 of the liquid storage tank 20 to the outside via the connector can be reduced.

In addition, in the sixth embodiment, the cooling-tank opening 31 of the connector 30 is opened in the horizontal direction, and air bubbles made of the gas-phase refrigerant are less likely to flow into the cooling-tank opening 31 than when the cooling-tank opening 31 is opened downward in the gravity direction. Accordingly, an outflow of the gas-phase refrigerant generated inside the cooling tank 10 to the outside from the atmosphere opening 21 of the liquid storage tank 20 through the cooling-tank opening 31 can be reduced, and a decrease in the refrigerant liquid 11 can be reduced.

The present disclosure is not limited to the embodiments described above, and can be variously modified as follows without departing from the gist of the present disclosure. The means disclosed in the individual embodiments may be appropriately combined as long as the combination is feasible.

For example, in each of the above embodiments, the electronic device 2 is immersed in the refrigerant liquid 11 and cooled in the cooling tank 10, but a heating element other than the electronic device 2 may be immersed in the refrigerant liquid 11 and cooled. The heating element to be cooled may be an object that generates heat and can be cooled by being immersed in the refrigerant liquid 11.

In the configuration of each of the above embodiments, an evaporation inhibitor may be provided on an upper surface of the refrigerant liquid 11 in the liquid storage tank 20. The upper surface of the refrigerant liquid 11 in the liquid storage tank is a contact surface with the atmosphere. The evaporation inhibitor only needs to reduce evaporation of the refrigerant liquid 11, and for example, oil for oil film covering the upper surface of the refrigerant liquid 11 in the liquid storage tank 20, particles covering the upper surface of the refrigerant liquid 11 in the liquid storage tank 20, or the like can be used.

In addition, in the fourth embodiment, the heat transfer portion 13 that promotes heat transfer between the refrigerant liquid 11 and the gas portion 12 is provided, but the heat transfer portion 13 may have a different configuration. For example, a heat transfer portion 13 may be provided across the atmosphere and the gas portion 12, and the heat transfer between the atmosphere and the gas portion 12 may be promoted by the heat transfer portion 13 to cool the gas portion 12. In this case, the heat transfer portion 13 may be exposed to the outside of the cooling tank 10, and the heat transfer portion 13 may be provided so as to straddle the outside and the inside of the cooling tank 10.

Further, the cooling-tank opening 31 of the connector 30 is opened downward in the gravity direction in the first to fifth embodiments and is opened in the horizontal direction in the sixth embodiment, but a cooling-tank opening 31 may be opened upward in the gravity direction. Accordingly, air bubbles formed of the gas-phase refrigerant is difficult to flow into the cooling-tank opening 31, the gas-phase refrigerant from flowing out from the atmosphere opening 21 of the liquid storage tank 20 to the outside through the cooling-tank opening 31 can be reduced, and a decrease in the refrigerant liquid 11 can be reduced.

In each of the above embodiments, the heat insulating portion 40 is the air layer in the gap between the cooling tank 10 and the liquid storage tank 20. However, the configuration is not limited to this, and a heat insulating portion 40 may include a heat insulating member between the cooling tank 10 and the liquid storage tank 20 to form a heat insulating portion 40.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A cooling device comprising: a cooling tank configured to store refrigerant liquid for immersing and cooling a heating element; a liquid storage tank configured to store the refrigerant liquid outside the cooling tank and having an atmosphere opening portion opening to an atmosphere; and a connector connecting the liquid storage tank and the cooling tank and allowing the refrigerant liquid to pass through the connector, wherein one end of the connector facing the cooling tank has a cooling-tank opening portion located in a gravity direction at a position lower than or same as a liquid level of the refrigerant liquid in the cooling tank, an upper portion of the cooling tank stores a gas generated in the cooling tank, the refrigerant liquid flows between the cooling tank and the liquid storage tank via the connector in accordance with a change in volume of the gas in the upper portion of the cooling tank, the liquid storage tank is provided upward of the cooling tank in the gravity direction, the cooling tank and the liquid storage tank are connected only by the connector, and the connector connects the liquid storage tank and the cooling tank without a valve such that a volume of the refrigerant liquid in the liquid storage tank increases and decreases in response to decrease and increase of a volume of the refrigerant liquid in the cooling tank; wherein the connector is partially submerged in the cooling tank and fluidly connects the liquid storage tank and the cooling tank together.

2. The cooling device according to claim 1, wherein
the refrigerant liquid in the cooling tank is capable of boiling due to heat generation of the heating element, and
the heating element is cooled by subcool boiling of the refrigerant liquid.

3. The cooling device according to claim 1, further comprising
a heat exchanger configured to cool the refrigerant liquid in the cooling tank; and
a circulation circuit configured to circulate the refrigerant liquid in the cooling tank to the heat exchanger.

4. The cooling device according to claim 1, wherein
the heating element is an electronic device, and
a wire of the electronic device is extracted to an outside from the atmospheric opening portion.

5. The cooling device according to claim 1, wherein
the cooling-tank opening portion is located upward of the heating element in the cooling tank in the gravity direction.

6. The cooling device according to claim 1, further comprising
a heat transfer portion in contact with the refrigerant liquid and the gas in the cooling tank and configured to promote heat exchange between the refrigerant liquid and the gas in the upper portion of the cooling tank.

7. The cooling device according to claim 1, wherein
the liquid storage tank includes oil as an oil film covering an upper surface of the refrigerant liquid.

8. The cooling device according to claim 1, wherein
the connector is a cylindrical member defining a through hole that directly communicates the liquid storage tank and the cooling tank.

* * * * *